United States Patent
Unrath et al.

(10) Patent No.: US 6,816,294 B2
(45) Date of Patent: Nov. 9, 2004

(54) ON-THE-FLY BEAM PATH ERROR CORRECTION FOR MEMORY LINK PROCESSING

(75) Inventors: Mark Unrath, Portland, OR (US); Kelly Bruland, Portland, OR (US); Ho Wai Lo, Portland, OR (US); Stephen Swaringen, Rockwall, TX (US)

(73) Assignee: Electro Scientific Industries, Inc., Portland, OR (US)

( * ) Notice: Subject to any disclaimer, the term of this patent is extended or adjusted under 35 U.S.C. 154(b) by 92 days.

(21) Appl. No.: 10/077,691

(22) Filed: Feb. 15, 2002

(65) Prior Publication Data

US 2002/0117481 A1 Aug. 29, 2002

Related U.S. Application Data

(60) Provisional application No. 60/269,646, filed on Feb. 16, 2001.

(51) Int. Cl.[7] .............................................. G02B 26/08
(52) U.S. Cl. .................. 359/225; 359/199; 219/121.78; 219/121.8
(58) Field of Search ................................ 359/199, 202, 359/225; 219/121.28, 121.29, 121.31, 121.74, 121.78, 121.8, 121.82; 250/234

(56) References Cited

U.S. PATENT DOCUMENTS

| | | | | |
|---|---|---|---|---|
| 4,001,840 A | * | 1/1977 | Becker et al. ............... 347/259 |
| 4,532,402 A | | 7/1985 | Overbeck ............. 219/121 LU |
| 4,544,889 A | | 10/1985 | Hendriks et al. ......... 324/158 P |
| 4,685,775 A | | 8/1987 | Goodman et al. .......... 350/486 |
| 4,941,082 A | | 7/1990 | Pailthorp et al. ...... 364/167.01 |
| 5,126,648 A | | 6/1992 | Jacobs ........................ 318/640 |
| 5,262,707 A | | 11/1993 | Okazaki et al. ............. 318/592 |
| 5,295,014 A | * | 3/1994 | Toda ........................... 359/202 |
| 5,452,275 A | | 9/1995 | Ogawa ..................... 369/44.11 |
| 5,571,430 A | * | 11/1996 | Kawasaki et al. ..... 219/121.78 |
| 5,629,790 A | * | 5/1997 | Neukermans et al. ....... 359/198 |
| 5,666,202 A | | 9/1997 | Kyrazis ....................... 356/375 |
| 5,673,110 A | | 9/1997 | Erickson et al. ............ 356/357 |
| 5,751,585 A | | 5/1998 | Cutler et al. ........... 364/474.03 |
| 5,798,927 A | | 8/1998 | Cutler et al. ............. 364/474.3 |
| 5,847,960 A | | 12/1998 | Cutler et al. ........... 364/474.29 |
| 5,940,789 A | | 8/1999 | Yuan .......................... 702/150 |
| 5,946,152 A | | 8/1999 | Baker ......................... 359/872 |
| 6,088,107 A | | 7/2000 | Livingston .................. 356/375 |
| 6,144,118 A | | 11/2000 | Cahill et al. .................. 310/12 |

OTHER PUBLICATIONS

US 2002/0050571 A1, filed Aug. 13, 2001, of Watson, for Long Stroke Mover for a Stage Assembly, U.S. Class 250/491.1.
"Precision Fast Steering Mirrors," Ball Aerospace & Technologies Corp., Bolder, CO, ©1999, pp. 1–3.
"S–330 QxQy Ultra–Fast Piezo Tip/Tilt Platforms," Physik Instrumente (PI) GmbH & Co., Karlsruhe, Germany, printed Feb. 5, 2002 from www.physikinstrumente.com/pztactiveoptics/3_10.html, pp. 1–5.

* cited by examiner

*Primary Examiner*—Audrey Chang
*Assistant Examiner*—Denise S. Allen
(74) *Attorney, Agent, or Firm*—Stoel Rives LLP

(57) ABSTRACT

Laser beam positioners (300, 340) employ a steering mirror (236, 306) that performs small-angle deflection of a laser beam (270) to compensate for cross-axis (110) settling errors of a positioner stage (302). A two-axis mirror is preferred because either axis of the positioner stages may be used for performing work. In one embodiment, the steering mirror is used for error correction only without necessarily requiring coordination with the positioner stage position commands. A fast steering mirror employing a flexure mechanism and piezoelectric actuators to tip and tilt the mirror is preferred in semiconductor link processing ("SLP") applications. This invention compensates for cross-axis settling time, resulting in increased SLP system throughput and accuracy while simplifying complexity of the positioner stages because the steering mirror corrections relax the positioner stage servo driving requirements.

19 Claims, 6 Drawing Sheets

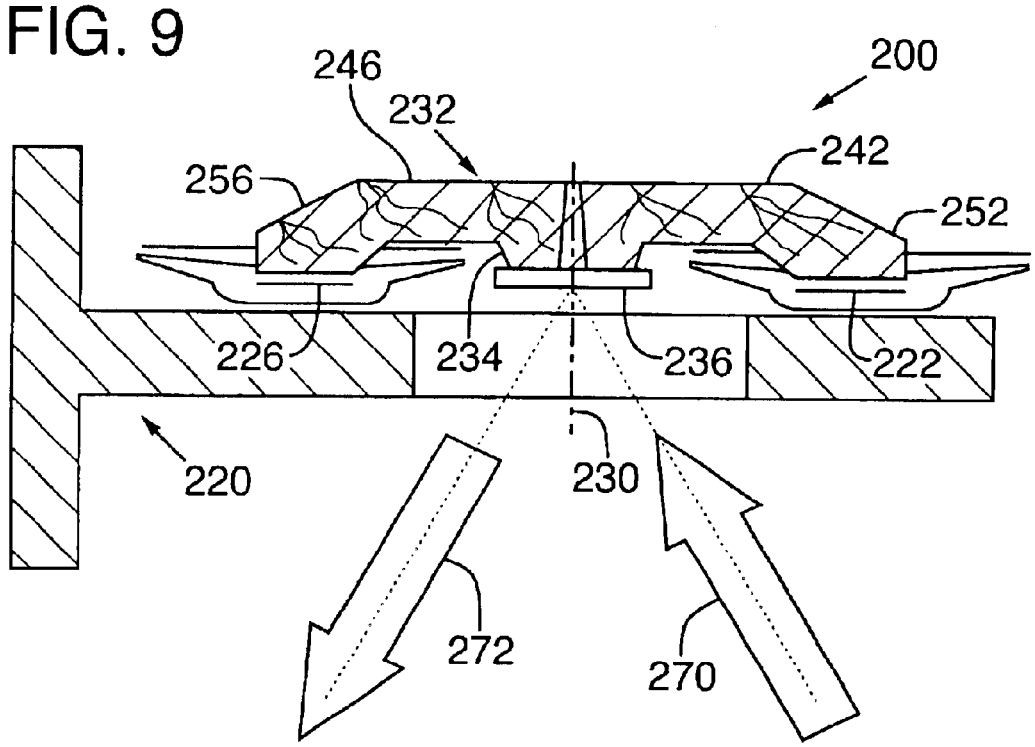
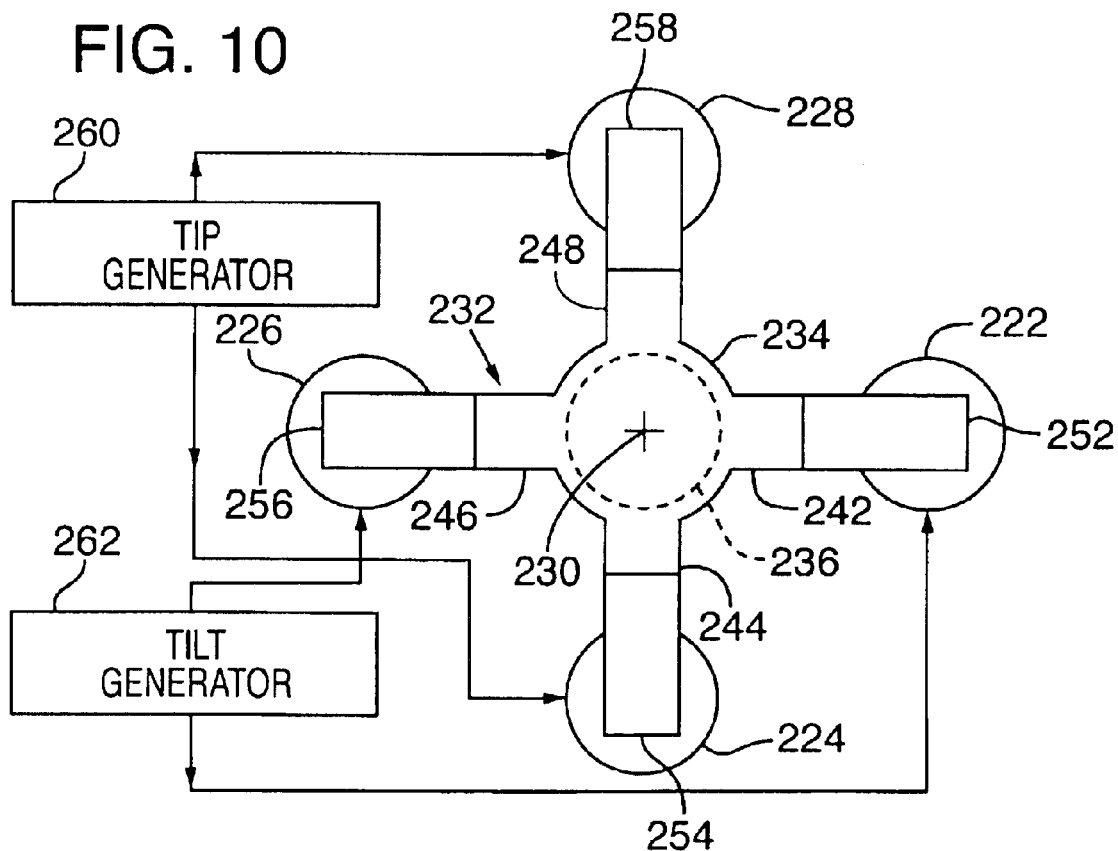

ON-THE-FLY BEAM PATH ERROR CORRECTION FOR MEMORY LINK PROCESSING

RELATED APPLICATIONS

This application claims priority from U.S. Provisional Application No. 60/269,646, filed Feb. 16, 2001.

TECHNICAL FIELD

This invention relates to laser processing of circuit links and, in particular, to a laser system and method employing a laser beam and substrate positioning system that incorporates a steering mirror to compensate for stage positioning errors and enhance link severing throughput.

BACKGROUND OF THE INVENTION

Yields in integrated circuit ("IC") device fabrication processes often incur defects resulting from alignment variations of subsurface layers or patterns or particulate contaminants. FIGS. 1, 2A, and 2B show repetitive electronic circuits 10 of an IC device or workpiece 12 that are typically fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable circuit links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program a logic product, gate arrays, or ASICs.

Links 22 are designed with conventional link widths 28 of about 2.5 microns, link lengths 30, and element-to-element pitches (center-to-center spacings) 32 of about 8 microns from adjacent circuit structures or elements 34, such as link structures 36. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys such as nickel chromide, metal nitrides such as titanium or tantalum nitride, metal suicides such as tungsten silicide, or other metal-like materials.

Circuits 10, circuit elements 14, or cells 20 are tested for defects. The links to be severed for correcting the defects are determined from device test data, and the locations of these links are mapped into a database or program. Laser pulses have been employed for more than 20 years to sever circuit links 22. FIGS. 2A and 2B show a laser spot 38 of spot size diameter 40 impinging a link structure 36 composed of a link 22 positioned above a silicon substrate 42 and between component layers of a passivation layer stack including an overlying passivation layer 44 (shown in FIG. 2A but not in FIG. 2B) and an underlying passivation layer 46 (shown in FIG. 2B but not in FIG. 2A). FIG. 2C is a fragmentary cross-sectional side view of the link structure of FIG. 2B after the link 22 is removed by the laser pulse.

FIG. 3 is a plan view of a beam positioner travel path 50 performed by a traditional link processing positioning system. Because links 22 are typically arranged in rows 16 and columns 18 (representative ones shown in dashed lines), the beam position and hence the laser spots 38 are scanned over link positions along an axis in a first travel direction 52, moved to a different row 16 or column 18, and then scanned over link positions along an axis in a second travel direction 54. Skilled persons will appreciate that scanning may include moving the workpiece 12, moving the laser spot 38, or moving the workpiece 12 and the laser spot 38.

Traditional positioning systems are characterized by X-Y translation tables in which the workpiece 12 is secured to an upper stage that moves along a first axis and is supported by a lower stage that moves along a second axis that is perpendicular to the first axis. Such systems typically move the workpiece relative to a fixed beam position or laser spot 38 and are commonly referred to as stacked stage positioning systems because the lower stage supports the inertial mass of the upper stage which supports workpiece 12. These positioning systems have excellent positioning accuracy because interferometers are typically used along each axis to determine the absolute position of each stage. This level of accuracy is preferred for link processing because the laser spot size 40 is typically only a little bigger than link width 28, so even a small discrepancy between the position of laser spot 38 and link 22 can result in incomplete link severing. In addition, the high density of features on semiconductor wafers results in small positioning errors potentially causing laser damage to nearby structures. Stacked stage positioning systems are, however, relatively slow because the starting, stopping, and change of direction of the inertial mass of the stages increase the time required for the laser tool to process all the designated links 22 on workpiece 12.

In split-axis positioning systems, the upper stage is not supported by, and moves independently from, the lower stage and the workpiece is carried on a first axis or stage while the tool, such as a fixed reflecting mirror and focusing lens, is carried on the second axis or stage. Split-axis positioning systems are becoming advantageous as the overall size and weight of workpieces 12 increase, utilizing longer and hence more massive stages.

More recently, planar positioning systems have been employed in which the workpiece is carried on a single stage that is movable by two or more actuators while the tool remains in a substantially fixed position. These systems translate the workpiece in two dimensions by coordinating the efforts of the actuators. Some planar positioning systems may also be capable of rotating the workpiece.

Semiconductor Link processing ("SLP") systems built by Electro Scientific Industries, Inc. ("ESI") of Portland, Oreg. employ on-the-fly ("OTF") link processing to achieve both accuracy and high throughput. During OTF processing, the laser beam is pulsed as a linear stage beam positioner passes designated links 12 under the beam position. The stage typically moves along a single axis at a time and does not stop at each link position. The on-axis position of beam spot 38 in the direction travel 52 does not have to be accurately controlled; rather, its position is accurately sensed to trigger laser spot 38 to hit link 22 accurately.

In contrast and with reference again to FIG. 3, the position of beam spot 38 along cross-axes 56 or 58 is controlled within specified accuracy as the beam positioner passes over each link 22. Due to the inertial mass of the stage or stages, a set-up move to start an OTF run produces ringing in the cross-axis position, and the first link 22 in an OTF run cannot be processed until the cross-axis position has settled properly. The settling delay or setting distance 60 reduces processing throughput. Without a settling delay (or, equivalently, a buffer zone of settling distance 60) inserted before the first laser pulse, several links 22 would be processed with serious cross-axis errors.

Although OTF speed has been improved by accelerating over gaps in the link runs, one limiting factor on the effectiveness of this "gap profiling" is still the requirement for the cross axis to settle within its specified accuracy. At the same time, feature sizes, such as link length 30 and link pitch 32, are continuing to decrease, causing the need for dimensional precision to increase. Efforts to further increase the performance of the stage or stages substantially increase the costs of the positioning system.

The traditional way to provide for two-axis deflection of a laser beam employs a high-speed short-movement positioner ("fast positioner") 62, such as a pair of galvanometer driven mirrors 64 and 66 shown in FIG. 4. FIG. 4 is a simplified depiction of a galvanometer-driven X-axis mirror 64 and a galvanometer-driven Y-axis mirror 66 positioned along an optical path 70 between a fixed mirror 72 and focusing optics 78. Each galvanometer-driven mirror deflects the laser beam along a single axis. U.S. Pat. No. 4,532,402 of Overbeck discloses a stacked stage beam positioning system that employs such a fast positioner, and U.S. Pat. Nos. 5,751,585 and 5,847,960 of Cutler et al. disclose split-axis beam positioning systems in which the upper stage(s) carry at least one fast positioner. Systems employing such fast positioners are used for nonlink blowing processes, such as via drilling, because they cannot currently deliver the beam as accurately as "fixed" laser head positioners.

The split-axis nature of such positioners may introduce rotational Abbe errors, and the galvanometers may introduce additional positioning errors. In addition, because there must be separation between the two galvanometer-controlled mirrors, the mirrors cannot both be located near the entrance pupil to the focusing optics. This separation results in an offset of the beam that can degrade the quality of the focused spot. Moreover, two-mirror configurations constrain the entrance pupil to be displaced farther from the focusing optics, resulting in an increased complexity and limited numerical aperture of the focusing optics, therefore limiting the smallest achievable spot size. Even assuming such positioners could be used for link-severing, the above-described spot quality degradation would cause poor quality link-severing or incomplete link-severing and result in low open resistance across severed links 22.

What is still needed, therefore, is a system and method for achieving higher link-processing throughput while maintaining focused spot quality.

SUMMARY OF THE INVENTION

An object of the invention is, therefore, to provide a system and/or method for achieving higher link-processing throughput while maintaining focused spot quality.

Another object of the invention is to employ a two-axis steering mirror to correct for linear stage settling errors.

Yet another object of the invention is to provide a positioner system employing coordinated motion for semiconductor link processing applications.

This invention preferably employs a two-axis steering mirror, pivotally mounted at the entrance pupil of the focusing lens, to perform small-angle motions that deflect the laser beam enough to compensate for cross-axis settling errors on the order of tens of microns. Although the settling errors occur in both axes, one embodiment of this invention is concerned primarily with correcting settling errors in a cross-axis direction to the OTF direction of linear stage travel. A two-axis steering mirror is employed for these corrections because either axis of the linear stage may be used as the OTF axis. The beam steering mirror is preferably used for error correction only and does not require coordination with or modification of the linear stage position commands, although such coordination is possible.

At least three technologies can be used to tilt a mirror in two axes about a single pivot point. These technologies include fast steering mirrors ("FSMs") that employ a flexure mechanism and voice coil actuators to tilt the mirror, piezoelectric actuators that rely upon deformation of piezoelectric materials to tilt a mirror, and deformable mirrors that employ piezoelectric or electrostrictive actuators to deform the surface of the mirror. Piezoelectric actuators are preferred.

Advantages of the invention include the elimination of cross-axis settling time, resulting in increased throughput particularly for SLP systems. The invention also facilitates improved manufacturability of the main positioning stage(s) due to relaxed servo performance requirements because the steering mirror can correct for linear stage errors.

Additional objects and advantages of this invention will be apparent from the following detailed description of preferred embodiments thereof which proceed with reference to the accompanying drawings.

BRIEF DESCRIPTION OF THE DRAWINGS

FIG. 9 is a side sectional view of a representative two-axis steering mirror.

FIG. 10 is a simplified plan view of a representative two-axis steering mirror.

DETAILED DESCRIPTION OF PREFERRED EMBODIMENTS

One embodiment of a representative beam positioning system is described in detail in U.S. Pat. No. 4,532,402 of Overbeck, which is assigned to the assignee of this application. A preferred X-Y stage is a "Dynamix" model available from Newport Corporation of Irvine, Calif.

The beam positioning system preferably employs a laser controller that controls a stacked, split-axis, or planar positioner system and coordinates with reflectors to target and focus laser system output to a desired laser link 22 on IC device or workpiece 12. The beam positioning system permits quick movement between links 22 on the same or different workpieces 12 to effect unique link-severing operations based on provided test or design data. The beam positioning system may alternatively or additionally employ the improvements, beam positioners, or coordinated motion schemes described in U.S. Pat. Nos. 5,751,585, 5,798,927, and 5,847,960 of Cutler et al., which are assigned to the assignee of this application. Other fixed head or linear motor driven conventional positioning systems could also be employed, as well as the systems employed in the 9000, 9800, and 1225 model series manufactured by ESI of Portland, Oreg., the assignee of this application.

Figure 4:
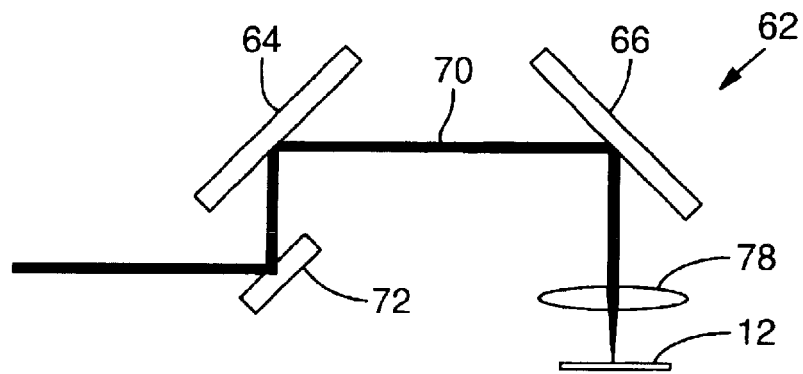
FIG. 4 is a simplified side view of a prior art fast positioner employing a pair of galvanometer-driven mirrors that deflect the laser beam along different respective single axes.
Figure 5:
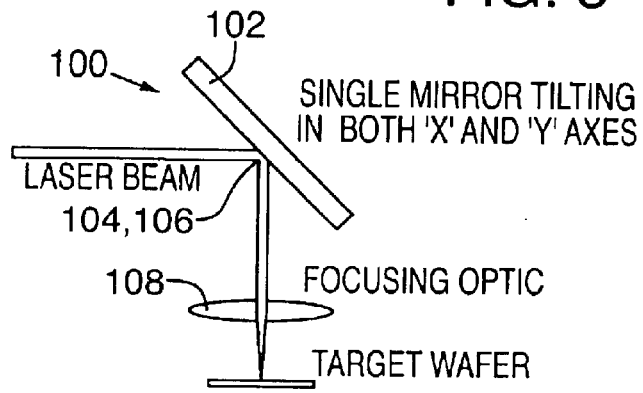
FIG. 5 schematically illustrates a side sectional view of a preferred two-axis mirror employed in the practice of the invention.
Figure 6:
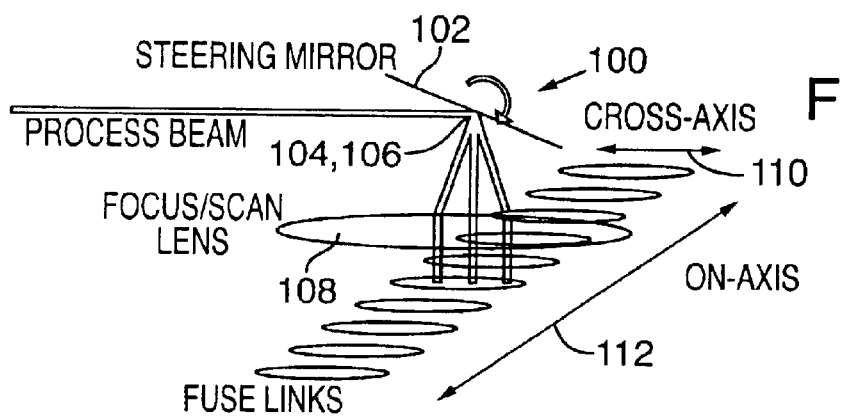
FIG. 6 schematically illustrates a partial front view of a preferred two-axis mirror employed in the practice of the invention.

With reference to FIGS. 5 and 6 and with respect to this invention, the final turn mirror of a fixed head system or alternatively fast positioner 66 (FIG. 4) is preferably replaced by a single high-speed, high-accuracy two-axis steering mirror system 100 that includes a mirror 102 capable of actuation with at least two degrees of freedom. Mirror 102 has a centrally positioned pivot point 104 that preferably coincides with an entrance pupil 106 of a focusing lens 108. Two-axis steering mirror system 100 is preferably used for error correction, although it may be employed for beam steering because either axis of the linear stage maybe used as the OTF axis.

Because the beam is focused to a very fine spot size for SLP applications, the mechanism directing mirror system 100 preferably pivots the mirror 102 along at least two axes about pivot point 104, which is located at or near the entrance pupil of focusing optics or lens 108. Small angle perturbations in the position of mirror 102 deflect the beam enough to correct for linear stage settling errors at the work surface, and because mirror 102 is located at or near the entrance pupil of focusing lens 108, the beam is shifted without distorting the focused spot, allowing delivery of a small, high quality spot.

In one embodiment, settling errors in a cross-axis direction 110 are corrected by mirror 102, while motion in an on-axis direction 112 is not corrected. This single axis correction allows the linear stage interferometer feedback to be the sole source of laser pulse triggering. However, with proper coordination, on-axis direction 112 steering mirror 102 motion is possible, although it complicates the design and introduces additional error sources that can degrade on-axis direction 112 accuracy if such errors are not addressed.

Motion in each axis of mirror 102 exhibits scale factor and offset errors, noise, and cross-axis coupling. These error source can be well-controlled and calibrated out in the system, with noise and temperature stability effects controlled through conventional design techniques.

Figure 1:
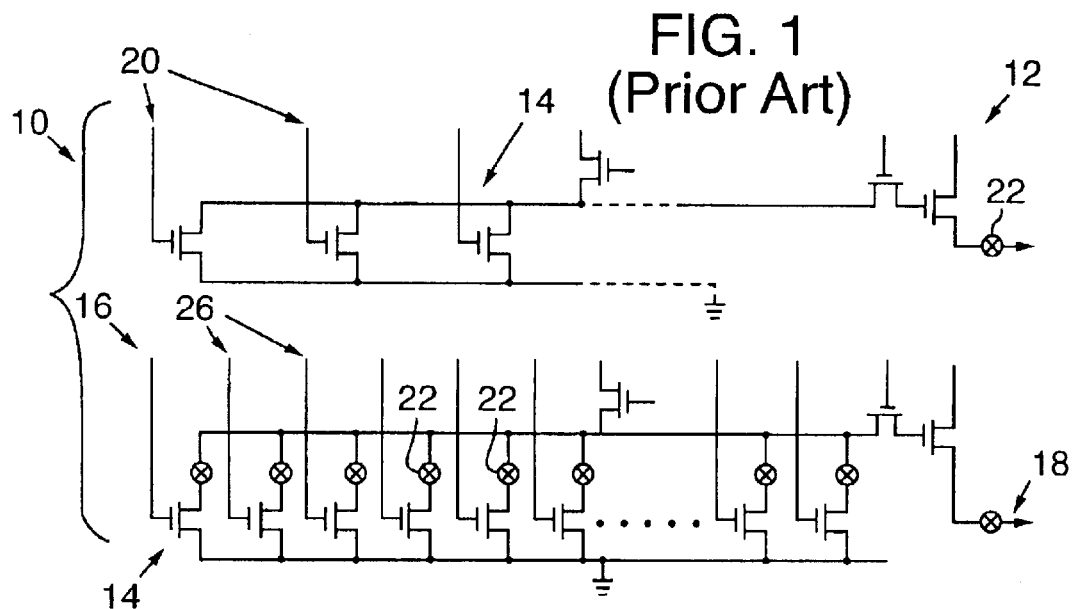
FIG. 1 is a schematic diagram of a portion of a DRAM showing the redundant layout of and programmable links in a spare row of generic circuit cells.
Figure 2A:
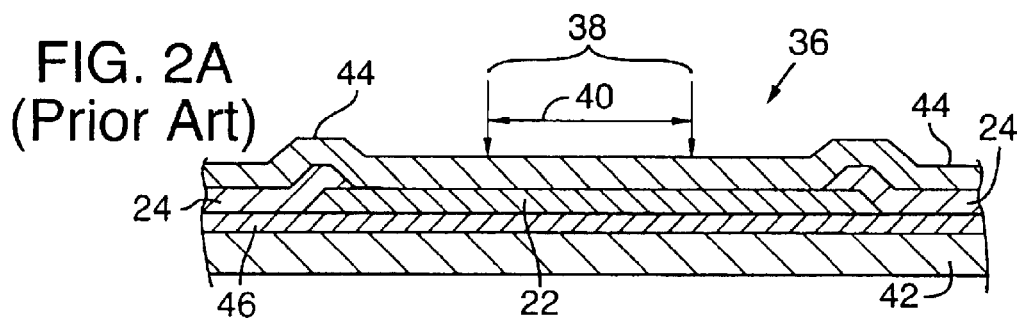
FIG. 2A is a fragmentary cross-sectional side view of a conventional, large semiconductor link structure receiving a laser pulse characterized by prior art pulse parameters.
Figure 2B:
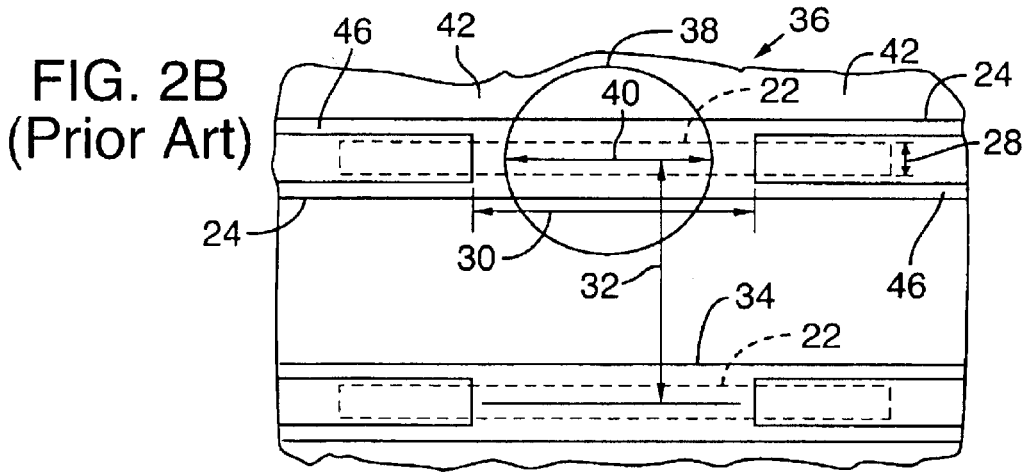
FIG. 2B is a fragmentary top view of the link structure and the laser pulse of FIG. 2A, together with an adjacent circuit structure.
Figure 2C:
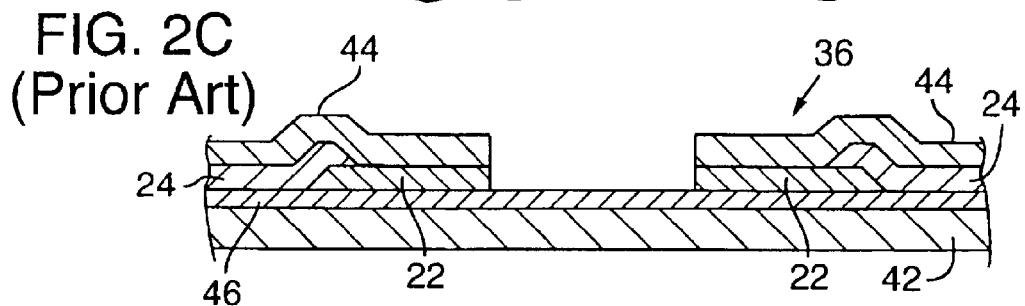
FIG. 2C is a fragmentary cross-sectional side view of the link structure of FIG. 2B after the link is removed by the prior art laser pulse.
Figure 3:
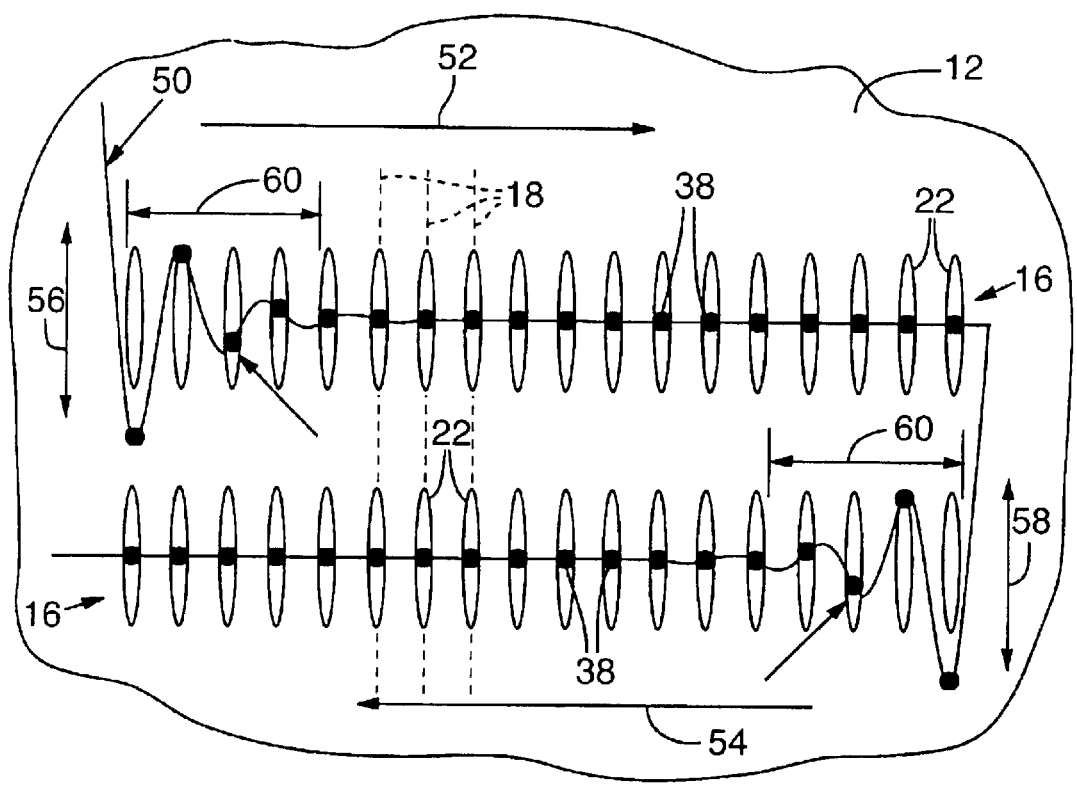
FIG. 3 is a plan view of a prior art beam travel path.

Calibration of mirror system 100 through beam-to-work ("BTW") alignments can correct for any non-linearity and alignment errors in steering mirror 102. Traditionally, the term beam-to-work is used as nomenclature for the process of scanning the linear stage back and forth, while directing the laser beam spot at low power at an alignment target on the wafer or workpiece 12 (FIG. 1). Optical measurements of the reflection off the target are used to precisely determine target and hence wafer location. By scanning several targets with BTW scans, the offset and rotation of the wafer relative to the beam spot can be ascertained. It is also possible to map out other effects such as axis orthogonality and positional distortions.

After mirror system 100 is added to the laser system, traditional BTW type scans can be used to map out any inaccuracies/nonlinearities in steering mirror 102 response. This is accomplished by doing a BTW scan with mirror 102 in the nominal zero offset (in either axis) position. Then mirror 102 is tilted, and another BTW scan is performed to determine how much lateral offset of the laser beam spot is imparted by the tilt. By measuring the offset caused by numerous mirror tilts in the U and V axes, mirror system 100 can be fully characterized.

Once the response of mirror system 100 is determined to sufficiently fine precision, then instead of moving the linear stage back and forth, it is possible to use mirror system 100 for subsequent BTW type alignment scans.

Figure 7:
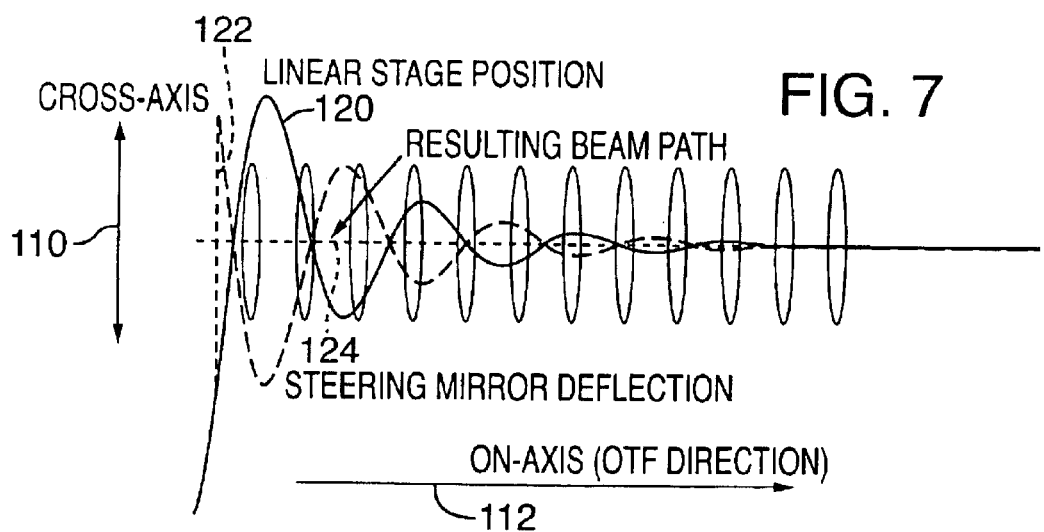
FIG. 7 illustrates the effect of the steering mirror during the OTF run.

FIG. 7 illustrates the corrective effect of two-axis steering mirror system 100 during an OTF run. A linear stage ringing is represented by a ringing curve 120. Mirror 102 deflects the laser beam in cross-axis direction 110 as represented by a correction curve 122 that is the inverse of ringing curve 120. The resulting beam position is the sum of the linear stage motion and the deflected beam position and is represented by a resulting beam path curve 124, which is free of cross-axis error.

Figure 8:
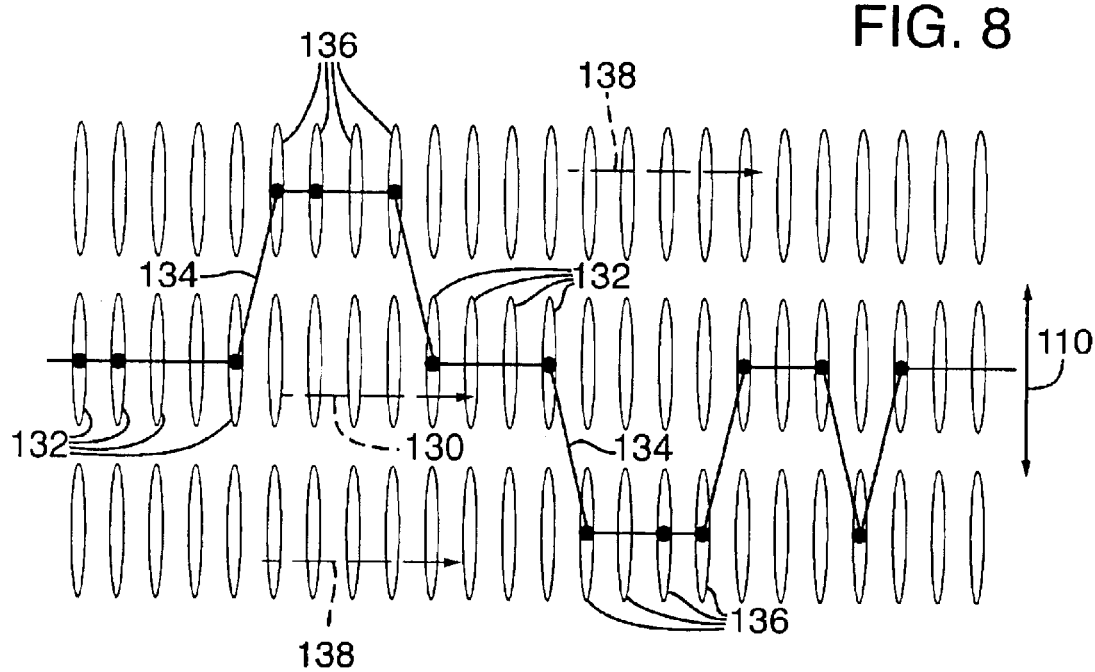
FIG. 8 illustrates an exemplary multi-row, cross-axis dithering ("MRCAD") work path.

FIG. 8 illustrates using steering mirror system 100 for MRCAD processing during boustrophedon or raster scanning in the context of link severing to further improve the speed at which links are blown. In a preferred mode of operation, MRCAD scanning is done in cross-axis direction 110 while moving along a row 130 of links 132. MRCAD scanning employs steering mirror 102 (FIGS. 5 and 6) to direct the laser beam along a pathway 134 at links 132 and adjacent links 136 in adjacent rows 138 without needing to move the slower linear motion stage in cross-axis direction 110. This is possible because not all the links in each row need to be blown. Link processing becomes far more efficient with MRCAD because the linear or stages do not have to be scanned or slewed down each row, so the total number of link row scans can be substantially reduced. As integration increases and link sizes, spot sizes, and pitch distance decrease, MRCAD scanning will become an even more valuable technique.

In another mode, supplemental on-axis dithering ("SOAD") uses mirror 102 to deflect the beam in on-axis direction 112 (FIGS. 5–7). In this operational mode, the beam can be quickly directed ahead in on-axis direction 112, severing links while the linear motion stage catches up. The SOAD scan ahead or scan behind the stage feature allows the positioning system to reduce stage velocity changes or to sever several links during a single slowed movement segment.

At least three technologies can be employed to tilt mirror 102 in two axes about pivot point 104. These technologies include FSMs that employ a flexure mechanism and voice coil actuators, piezoelectric actuators that rely upon deformation of piezoelectric materials, and piezoelectric or electrostrictive actuators to deform the surface of a mirror. Suitable voice coil actuated FSMs are available from Ball Aerospace Corporation of Broomfield, Colo. and Newport Corporation of Irvine, Calif. However, the preferred actuator is a model S-330 Ultra-Fast Piezo Tip/Tilt Platform manufactured by Physik Instrumente ("PI") GmbH & Co. of Karlsruhe, Germany.

Traditional galvanometers are not typically used for this application because they each tilt a mirror about only one axis and ordinarily have insufficient positioning accuracy. Moreover, a pair of physically separated galvanometer mirrors is required for two axes of actuation. This separation is incompatible with the desire that actuation occur about one pivot point located near the entrance pupil of focusing lens 108 (FIGS. 5 and 6) to maintain a high quality laser spot at the surface of workpiece 12. Nevertheless, it is possible to employ galvanometer deflected mirrors in this invention, particularly if employed in single-axis and small deflection applications to maintain accuracy and well focused laser spots.

By way of example only, FIGS. 9 and 10 show an FSM two-axis mirror system 200 in which four electrical to mechanical vibration generators or transducers are supported by a transducer support platform 220 in a quadrature relationship, whereby transducers 222, 224, 226, and 228 are positioned at 0, 90, 180, and 270 degrees with respect to a central axis 230; therefore, adjacent ones of the transducers are set at right angles with respect to each other. A movable mirror support member 232 has a central portion or hub 234 bearing a mirror or reflective surface 236 centered with respect to axis 230. Mirror 236 has a diameter of about 30 mm or less to reduce its weight and facilitate high frequency response for desired beam correction. Mirror 236 is coated with conventional laser optical coatings to account for laser wavelength or design parameters.

Four lightweight rigid struts or elongated members 242, 244, 246, and 248 extend radially from hub 234 of mirror support member 232, and have respective peripheral terminal portions 252, 254, 256, and 258 affixed to respective transducers 222, 224, 226, and 228, which are electrically movable voice coils. For a further description of a suitable conventional voice coil/loudspeaker arrangement, see Van Nostrand's Scientific Encyclopedia, Sixth Edition, page 1786. The use of such conventional loudspeaker coils for the transducers to perform mechanical actuation, decreases the manufacturing cost of the apparatus. The floating mirror support 232 can beneficially be made of a lightweight material, such as metal (e.g. aluminum or beryllium) or plastic, enabling rapid response to the electrical input signals to the voice coils to be described.

A tip control generator 260 is connected to transducers 224 and 228 to cause them to move in a complementary "push pull" relationship with each other. Similarly, a tilt control generator 262 is connected to transducers 222 and 226 to cause these coils to also move in a complementary push pull relationship with each other. A laser beam 270 is reflected off reflective surface 236 and a reflected beam 272 is positioned by the generators controlling the cross axis, which is perpendicular to OTF direction of travel, to compensate for cross axis errors. The pairs of signals produced by each generator assume a push-pull relationship, so that when transducer 222 is pulling upper terminal portion 252 of support member 232 to the right in FIG. 10, lower transducer 226 is pushing terminal portion 256 to the left, to tilt reflective surface 236, thereby deflecting reflected beam 272. The actuation can be alternated at the beginning of an OTF run, for example, to move reflective surface 236 at a proper frequency and damped amplitude to compensate for linear stage ringing in cross-axis direction 110, thereby eliminating the negative effects of linear stage settling time and producing a relatively straight beam path. Thus, links that would otherwise be in the conventional buffer zone can be processed accurately.

Mirror systems suitable for use with this invention can be implemented with a large enough field to do MRCAD scans by providing beam deflection in a range of about 50 to 100 microns; however, such mirror systems can also be implemented for cross-axis correction only by providing beam deflection in a range of about 10 to 50 microns or as little as about 10 to 20 microns. The mirror is preferably positioned within about plus or minus 1 mm of the entrance pupil of the focusing lens. These ranges are exemplary only and can be modified to suit the system design and particular link processing applications.

The preferred model S-330 Tip/Tilt Platform manufactured by PI uses piezoelectric actuators for high speed, two-dimensional mirror tilting. Strain gage sensors accurately determine mirror position and provide feedback signals to the control electronics and drive circuitry. A more complete description of the model S-330 Tip/Tilt Platform is available at the PI web site, www.physikinstrumente.com.

The main advantages of the PI Piezo Tip/Tilt Platform are that the device is commercially available and has a very compact size that readily mounts in an ESI model 9820 positioning system.

Disadvantages of the PI Piezo Tip/Tilt Platform are that it has insufficient beam deflection range for use in beam-to-work scanning applications even though its range is sufficient for error correction applications; and nonlinear motion, thermal drive, hysteresis, and high-voltage actuation are all inherent problems with piezoelectric actuation that have to be accounted for.

Of course, other vendors or other types of mirror or actuator designs are suitable for use with this invention.

In addition to all the other above-described advantages, this invention permits a relaxation on the requirements for the linear motors (jerk time, settling time) using the secondary system to correct for errors. This substantially reduces the cost of the linear motors and also reduces the dependency of the system throughput on the acceleration limit of the linear stage or stages.

Figure 11:
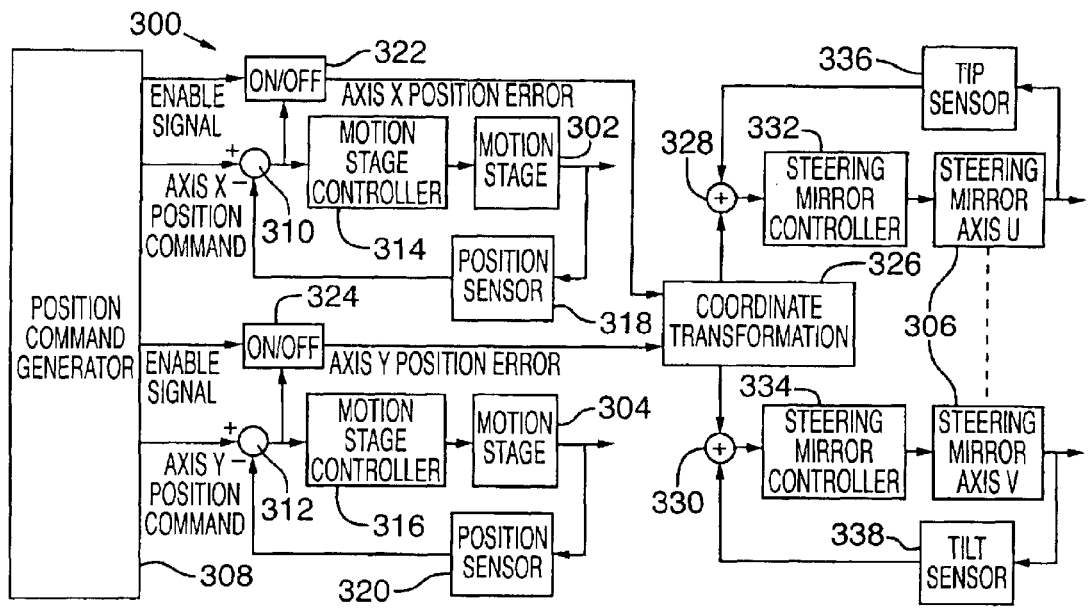
FIG. 11 is a simplified schematic block diagram of an exemplary positioner control system for coordinating the stage positioning and the steering mirror for error correction.

FIG. 11 shows an embodiment of a positioner control system 300 of this invention for coordinating the positioning of X- and Y-axis motion stages 302 and 304, and also the positioning of a two-axis steering mirror 306 for positioning error correction. Of course, motion stages 302 and 304 may be combined into a single planar motion stage having positioning control in the X- and Y-axis directions. In a standard operational mode, two-axis steering mirror 306 is used to correct positioning errors caused by X- and Y-axis motion stages 302 and 304.

A position command generator 308 generates X- and Y-axis position command signals for delivery through summing junctions 310 and 312 to X- and Y-axis motion controllers 314 and 316 to respective X- and Y-axis motion stages 302 and 304. The actual positions of X- and Y-axis motion stages 302 and 304 are sensed by respective X- and Y-axis position sensors 318 and 320 and signals representing the actual positions are conveyed to adders or summing junctions 310 and 312 to generate X- and Y-axis position error signals. X- and Y-axis motion controllers 314 and 316 receive the error signals and act to minimize any errors between the commanded and actual positions. For high-accuracy applications, X- and Y-axis position sensors 318 and 320 are preferably interferometers.

Residual error signals, such as those generated by ringing, are conveyed through enabling gates 322 and 324 to a coordinate transformation generator 326, which may be optional depending on whether motion stages 302 and 304 share a common coordinate system with two-axis steering mirror 306. In either event, the residual error signals are passed through adders or summing junctions 328 and 330 to U- and V-axis steering mirror controllers 332 and 334, which act to tip and/or tilt steering mirror 306 by controlled amounts to deflect, for example, laser beam 270 (FIG. 9) to correct for positioning errors of X- and Y-axis motion stages 302 and 304. The actual tip and/or tilt positions of two-axis steering mirror 306 are sensed by respective tip and tilt sensors 336 and 338 and signals representing the actual tip and tilt positions are conveyed to adders or summing junctions 328 and 330 to generate tip and tilt position error signals. U- and V-axis steering mirror controllers 332 and 334 receive the error signals and act to correct any errors between the commanded and actual positions. For high-accuracy applications, two-axis steering mirror 306 is preferably a piezoelectric tilt/tip platform, and position sensors 318 and 320 are preferably strain gages. Suitable alternative sensors may include optical, capacitive, and inductive sensing techniques. In this embodiment, skilled workers will understand that U- and V-axis steering mirror controllers 332 and 334 should be adapted to provide zero to 100 volt drive signals to the piezoelectric actuators deflecting two-axis steering mirror 306.

Enabling gates 322 and 324 implement a provision in which position command generator 308 can selectively disable position error correction for either the X or the Y axis, thereby enabling error correction for the cross-axis while leaving the on-axis unaffected, or vice versa.

Figure 12:
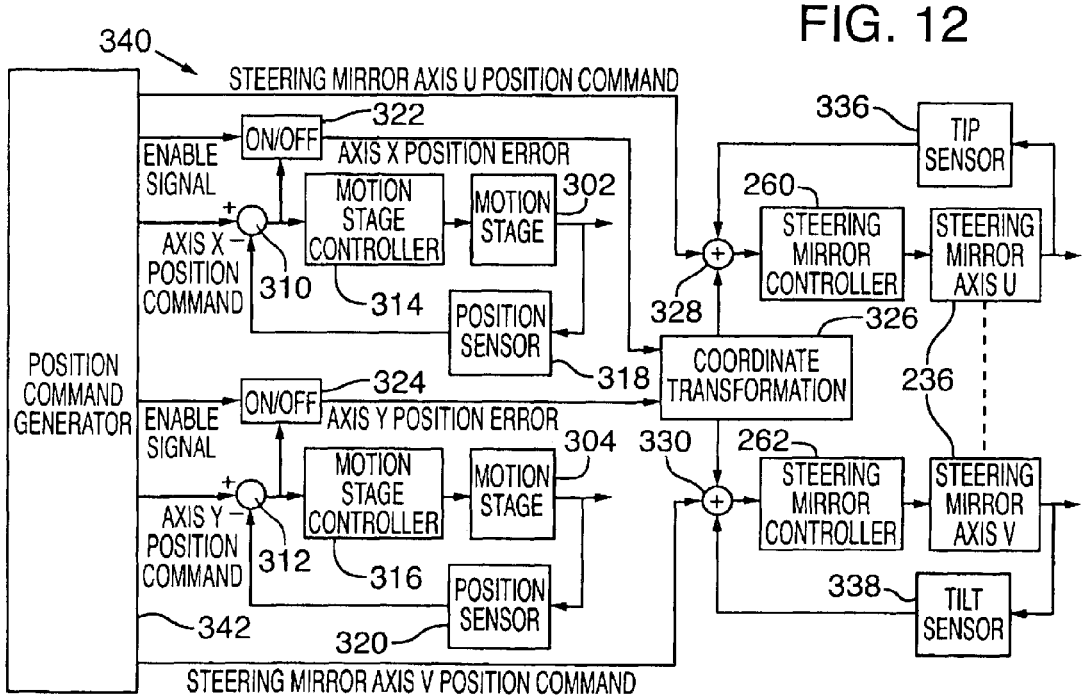
FIG. 12 is a simplified schematic block diagram of an exemplary positioner control system for coordinating the stage positioning and the steering mirror for beam-to-work scans and error correction.

FIG. 12 shows an embodiment of a positioner control system 340 for coordinating the positioning of X- and Y-axis motions stages 302 and 304 and, in this embodiment, FSM 236 (FIGS. 9 and 10) for MRCAD scans and positioning error correction. In an extended operational mode, the steering mirror is used for error correction and MRCAD scanning. In this mode of operation, a position command generator 342 generates X- and Y-axis positioning commands for X- and Y-axis motion stages 302 and 304 and also U- and V-axis tip and tilt commands for deflecting FSM 236. Summing junctions 328 and 330 generate the positioning command for FSM 236 as the sum of the error signals from X- and Y-axis motion stages 302 and 304 and, in this embodiment, also the U- and V-axis tip and tilt commands.

The error signals are generated in the same manner as in the standard error correction mode. The additional U- and V-axis tip and tilt commands are produced by position command generator 342 to accomplish the desired beam-to-work scanning. Because beam-to-work and MRCAD applications typically require wider ranges of mirror deflection, this embodiment of the invention preferably employs voice coil actuated FSM two-axis mirror system 200.

In typical operation, the position commands for MRCAD scanning are used to produce cross-axis motion of the laser beam without commanding cross-axis motion of the motion stages. However, other applications are envisioned that would benefit from on-axis supplemental dithering to boustrophedon scanning.

The control schemes depicted in these figures are intended to illustrate the basic implementation and operation of this invention. More advanced control schemes, such as those employing feedforward commands to the motion stages and steering mirror, will be obvious to those skilled in the art.

Skilled workers will appreciate that the two-axis steering mirror systems of this invention can be adapted for use in etched-circuit board via drilling, micro-machining, and laser trimming applications as well as for link severing.

It will be obvious to those having skill in the art that many changes may be made to the details of the above-described embodiment of this invention without departing from the underlying principles thereof. The scope of this invention should, therefore, be determined only by the following claims.

We claim:

1. An apparatus for directing a laser beam toward a target location on a workpiece in response to target location coordinate position command information, the workpiece having a workpiece surface, comprising:

a positioner positioning the workpiece and the laser beam relative to one another in response to the coordinate position command information;

first and second position sensors coupled to the positioner for producing first and second position signals indicative of an actual coordinate position of the positioner;

processing circuitry implemented to perform comparisons of the coordinate position command information and the first and second position signals and to provide from the comparisons one or more error signals indicative of a difference between the coordinate position command information and the actual coordinate position, the difference including a transient signal component representing laser beam position errors at the workpiece surface;

a steering mirror controller system producing a position correction signal in response to each error signal provided;

a two-axis steering mirror including a pivot point and positioned to receive the laser beam at or near the pivot point, the two-axis steering mirror, in response to the position correction signal, imparting to the laser beam angular motions that deflect the laser beam in a manner sufficient to compensate for the laser beam position errors; and a focusing lens having an entrance pupil and positioned to receive the deflected laser beam and focus it on the target location of the workpiece, the entrance pupil being set at or near the pivot point to provide a substantially distortion-free deflected laser beam.

2. The apparatus of claim 1 in which the position correction signal includes first and second position correction signal portions, the steering mirror controller system includes first and second steering mirror controllers, and the one or more error signals include first and second error signals that produce first and second position correction signals to which the first and second steering mirror controllers respond, and the first and second steering mirror controllers producing the respective first and second position correction signal portions to which the two-axis steering mirror responds to deflect the laser beam.

3. The apparatus of claim 1 in which the coordinate position command information includes information for positioning the positioner to respective X-axis and Y-axis orthogonal coordinate locations.

4. The apparatus of claim 2 in which the first and second error signals conform to a first coordinate system and the motion of the two-axis steering mirror is characterized with reference to a second coordinate system, and in which the apparatus further includes a coordinate transform generator for converting at least one of the first and second error signals to the second coordinate system.

5. The apparatus of claim 1 in which the steering mirror controller system includes first and second steering mirror controllers, and in which the target location coordinate position command information includes mirror positioning information, the first and second steering mirror controllers positioning the two-axis steering mirror in response to the mirror positioning information and the position correction signal.

6. The apparatus of claim 1 in which the two-axis steering mirror is positioned by at least one piezo electric actuator.

7. The apparatus of claim 1 in which the two-axis steering mirror is positioned by at least one voice coil actuator.

8. The apparatus of claim 1 in which the position correction signal includes a series of position correction signal components, and in which the positioner scans the workpiece and the laser beam relative to one another in a second axis direction in response to a series of coordinate position command information while the two-axis steering mirror is responsive to the series of position correction signal components to receive the laser beam and deflect it toward a set of the target locations on the workpiece.

9. The apparatus of claim 1 in which the workpiece includes an integrated memory circuit and in which the target location includes a severable link for removing a defective memory cell.

10. The apparatus of claim 1 in which the workpiece includes an electronic circuit element that is trimmed to a predetermined performance characteristic by the laser beam.

11. The apparatus of claim 1 in which the positioner includes stages that are arranged in a stacked configuration.

12. The apparatus of claim 1 in which the positioner includes stages that are arranged in a split-axis configuration.

13. The apparatus of claim 1 in which the positioner includes a planar positioning stage.

14. A method for directing a laser beam toward a target location on a workpiece in response to target location coordinate position command information, the workpiece having a workpiece surface, comprising:

positioning the workpiece and the laser beam relative to one another in response to the coordinate position command information;

sensing an actual coordinate position of the workpiece relative to the coordinate position command information;

producing one or more error signals indicative of a difference between the coordinate position command information and the actual coordinate position, the difference including a transient signal component representing laser beam position errors at the workpiece surface;

producing a position correction signal in response to each error signal produced;

positioning a two-axis steering mirror including a pivot point for receiving the laser beam at or near the pivot point, the two-axis steering mirror, in response to the position correction signal, imparting to the laser beam angular motions that deflect the laser beam in a manner sufficient to compensate for the laser beam position errors; and providing a focusing lens having an entrance pupil and positioned to receive the deflected laser beam and focus it on the target location on the workpiece, the entrance pupil being set at or near the pivot point to provide a substantially distortion-free deflected laser beam at the workpiece surface.

15. The method of claim 14 in which the one or more error signals include first and second error signals and the position correction signal includes first and second position correction signal portions, the first and second position correction signal portions produced in response to the respective first and second error signals to position the two-axis steering mirror.

16. The method of claim 14 which the coordinate position command information includes X-axis and Y-axis orthogonal coordinate locations.

17. The method of claim 14 in which the one or more error signals conform to a first coordinate system and the motion of the two-axis steering mirror is characterized with reference to a second coordinate system, and in which the method further includes transforming at least one of the error signals into the second coordinate system.

18. The method of claim 14 in which the target location coordinate position command information includes mirror positioning information, and the method further includes positioning the two-axis steering mirror in response to the mirror positioning information and the position correction signal.

19. The method of claim 14 in which the position correction signal includes a series of position correction signal components, and further including;

scanning the workpiece and the laser beam relative to one another in a second axis direction in response to a series of coordinate position command information; and moving the two-axis steering mirror in response to the series of position correction signal components.

* * * * *